United States Patent
Yeh et al.

(10) Patent No.: US 8,937,241 B2
(45) Date of Patent: Jan. 20, 2015

(54) SELF-ASSEMBLY NANO-COMPOSITE SOLAR CELL

(75) Inventors: Che-Ning Yeh, Hsinchu (TW); Chun-Te Ho, Hsinchu (TW); Tri-Rung Yew, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 295 days.

(21) Appl. No.: 13/458,272

(22) Filed: Apr. 27, 2012

(65) Prior Publication Data
US 2013/0284268 A1 Oct. 31, 2013

(51) Int. Cl.
*H01L 31/042* (2014.01)
*H01L 31/0384* (2006.01)
*H01L 31/0376* (2006.01)
*H01L 31/0352* (2006.01)

(52) U.S. Cl.
CPC .... *H01L 31/03845* (2013.01); *H01L 31/03767* (2013.01); *H01L 31/035227* (2013.01)
USPC ............ 136/243; 136/244; 136/245; 136/246

(58) Field of Classification Search
CPC ......................................... H01L 31/00–31/208
USPC .................................................. 136/243–265
See application file for complete search history.

(56) References Cited

U.S. PATENT DOCUMENTS

| 2010/0288345 A1* | 11/2010 | Huang .......................... 136/255 |
| 2011/0277822 A1* | 11/2011 | Zheng et al. ................... 136/252 |
| 2012/0312375 A1* | 12/2012 | Seok et al. ..................... 136/263 |

FOREIGN PATENT DOCUMENTS

KR WO2011102673 * 8/2011

* cited by examiner

*Primary Examiner* — Bach Dinh
(74) *Attorney, Agent, or Firm* — Muncy, Geissler, Olds & Lowe, P.C.

(57) ABSTRACT

A self-assembly nano-composite solar cell comprises a substrate, a first electrode layer, a composite absorption layer and a second electrode layer. The first electrode layer is formed on the substrate. The composite absorption layer is formed over the first electrode layer and includes a plurality of vertical nano-pillars, a plurality of gaps each formed between any two adjacent nano-pillars, and a plurality of bismuth sulfide nano-particles filled into the gaps and attached to the nano-pillars. The second electrode layer is formed over the composite absorption layer. Through etching and soaking in solutions, the composite absorption layer with nano-pillars and bismuth sulfide nano-particles is fabricated to form a self-assembly nano-composite solar cell having high power conversion efficiency.

9 Claims, 14 Drawing Sheets

US 8,937,241 B2

SELF-ASSEMBLY NANO-COMPOSITE SOLAR CELL

FIELD OF THE INVENTION

The present invention relates to a solar cell, particularly to a self-assembly nano-composite solar cell.

BACKGROUND OF THE INVENTION

With advance of nanotechnology, the quantum-dot structure has been applied to solar cells to greatly promote the energy conversion efficiency of solar cells.

When a semiconductor material is reduced to quantum dimension, its continuous conduction band gradually splits into narrow energy bands. Thus, electron cooling is slowed down, and the impact ionization effect and Auger recombination effect become obvious. The photoelectric conversion layer is highly associated with the power conversion efficiency of solar cells. Therefore, the application of a quantum-dot structure to the photoelectric conversion layer favors collecting effective carriers in the photoelectric conversion layer and thus promotes the power conversion efficiency of solar cells.

A US publication No. US2010/0288345 disclosed a quantum-dot thin-film solar cell, which comprises a substrate, a first electrode layer, an active layer, and a second electrode layer. The first electrode layer is arranged on the substrate, and the second electrode layer is arranged over the first electrode layer. The active layer is arranged between the first and second electrode layers, and two sides thereof respectively contact the first and second electrode layers. A plurality of quantum dots is formed inside the active layer to increase the power conversion efficiency of the solar cell.

The quantum dots can indeed increase the range of the absorbable wavelengths of the incident light. However, they can only increase the power conversion efficiency to a limited extent because of reflection of incident light and insufficient diffusion distance of carriers. Therefore, the conventional technology still has room to improve.

SUMMARY OF THE INVENTION

The primary objective of the present invention is to overcome the problem that the power conversion efficiency of the conventional quantum-dot thin-film solar can only be increased to a limited extent.

To realize the above-mentioned objective, the present invention proposes a self-assembly nano-composite solar cell, which comprises a substrate, a first electrode layer, a composite absorption layer, and a second electrode layer. The first electrode layer is arranged on the substrate. The composite absorption layer is arranged on the first electrode layer. The composite absorption layer further comprises a plurality of vertical nano-pillars, a plurality of gaps each formed between any two adjacent nano-pillars, and a plurality of bismuth sulfide nano-particles filled in the gaps and attached to the nano-pillars. The second electrode layer is arranged on the composite absorption layer, whereby the composite absorption layer is interposed between the first and second electrode layers.

The nano-pillars reduce reflection of the incident light and decrease the diffusion distance of carriers. The bismuth sulfide nano-particles increase the absorption wavelength range of the incident light to further promote the power conversion efficiency of the solar cell. Moreover, the composite absorption layer can be fabricated in a self-assembly way via etching and solution-soaking. Therefore, the present invention has advantages of simple processes, low cost, fast and large-area production.

DETAILED DESCRIPTION OF THE PREFERRED EMBODIMENTS

The technical contents of the present invention are described in detail in cooperation with drawings below.

Figure 1A:
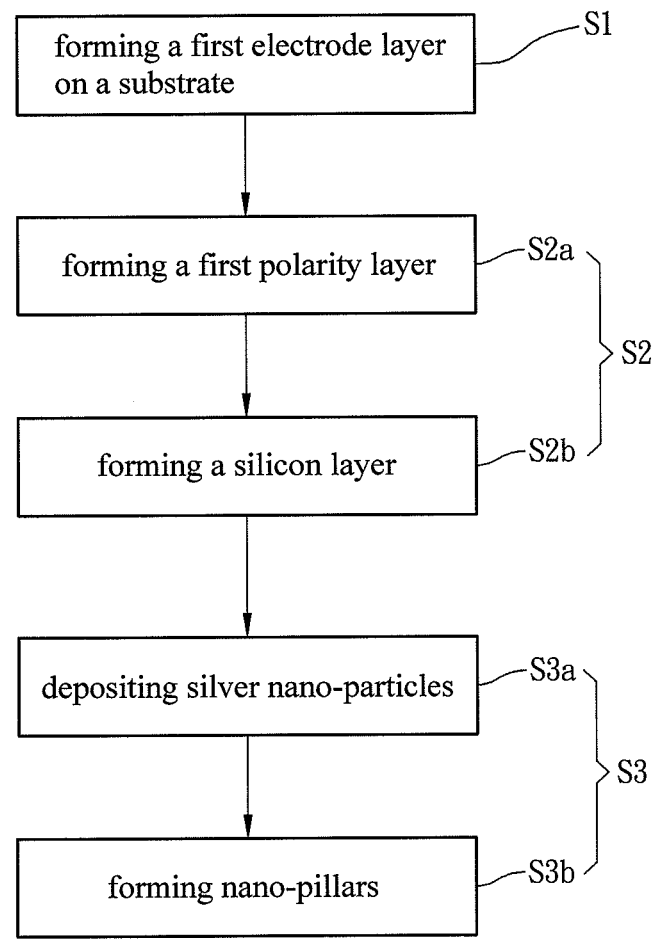
FIG. 1A and FIG. 1B are flowcharts of fabricating a self-assembly nano-composite solar cell according to one embodiment of the present invention.
Figure 1B:
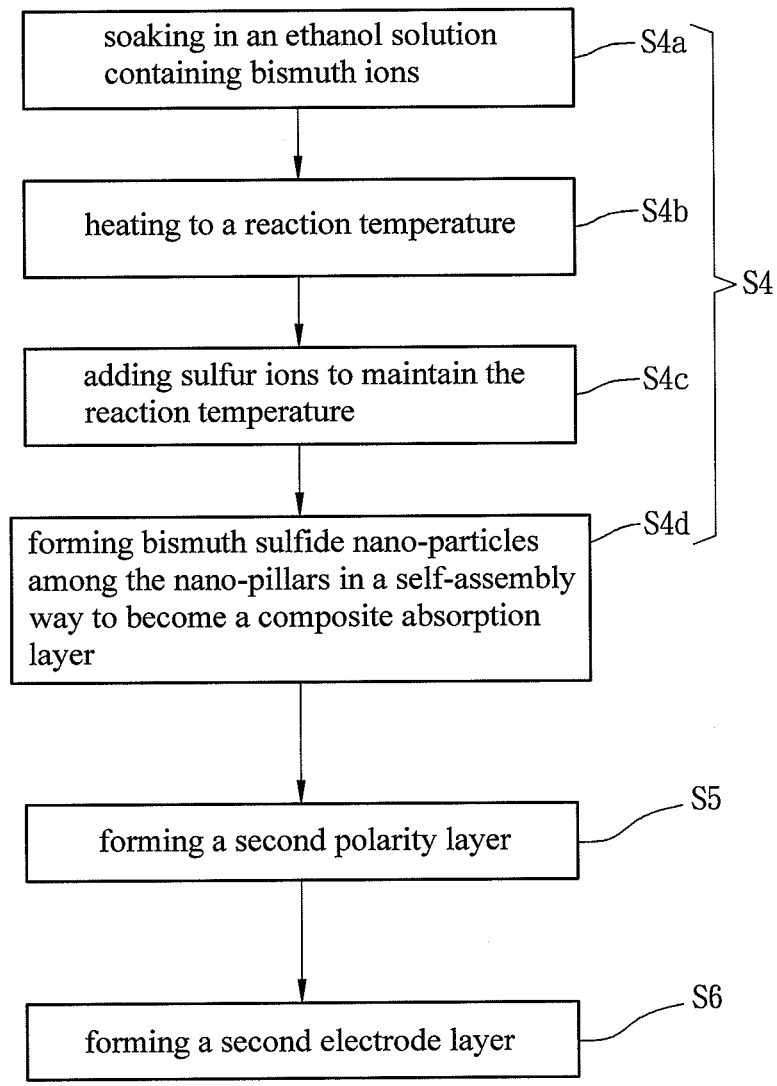
Figure 2A:
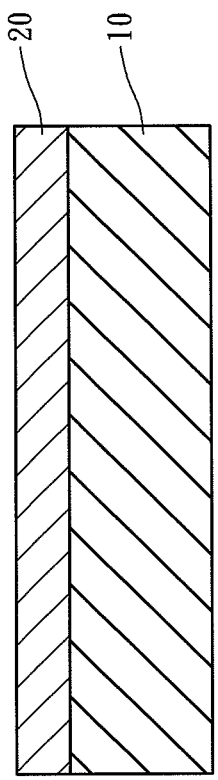
FIGS. 2A-2K are sectional views schematically showing a process of fabricating a self-assembly nano-composite solar cell according to one embodiment of the present invention.

Refer to FIG. 1A, FIG. 1B and FIGS. 2A-2K. FIG. 1A and FIG. 1B are flowcharts of fabricating a self-assembly nano-composite solar cell according to one embodiment of the present invention. FIGS. 2A-2K are sectional views schematically showing a process of fabricating a self-assembly nano-composite solar cell according to one embodiment of the present invention. The present invention proposes a self-assembly nano-composite solar cell, which is fabricated according to the following steps:

Step S1: form a first electrode layer 20 on a substrate 10, as shown in FIG. 2A. In this embodiment, the substrate 10 is made of glass. The first electrode layer 20 is made of transparent conductive oxide. In this embodiment, the first electrode layer 20 is made of indium tin oxide (ITO). However, the present invention does not constrain that the first electrode layer 20 should be made of ITO. In the present invention, the first electrode layer 20 may be alternatively made of tin oxide ($SnO_2$), zinc oxide (ZnO), aluminum zinc oxide (AZO), gallium zinc oxide (GZO), or indium zinc oxide (IZO).

Figure 2B:
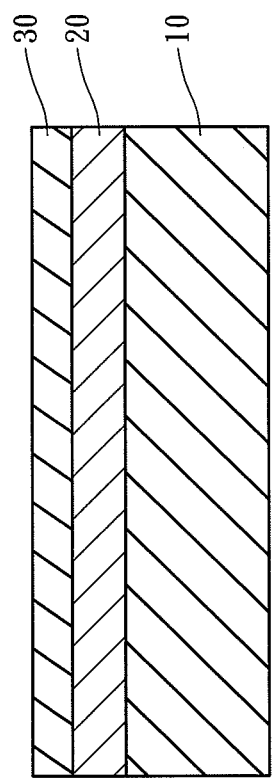
Figure 2C:
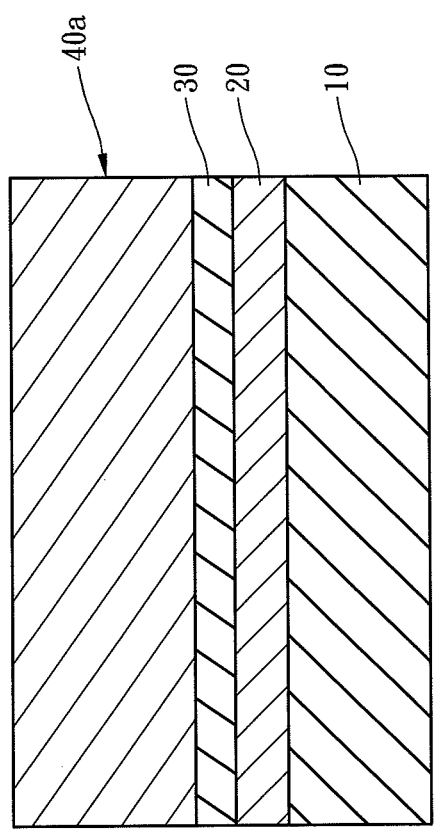
Figure 2D:
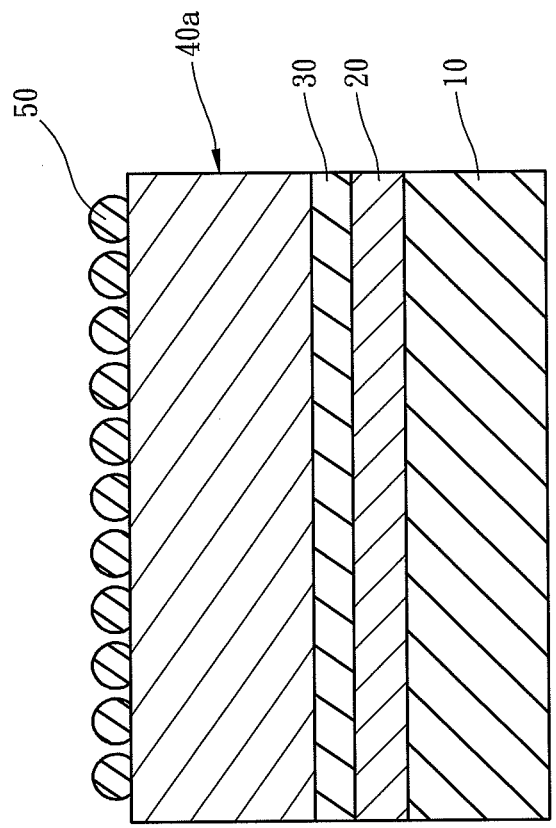
Figure 2E:
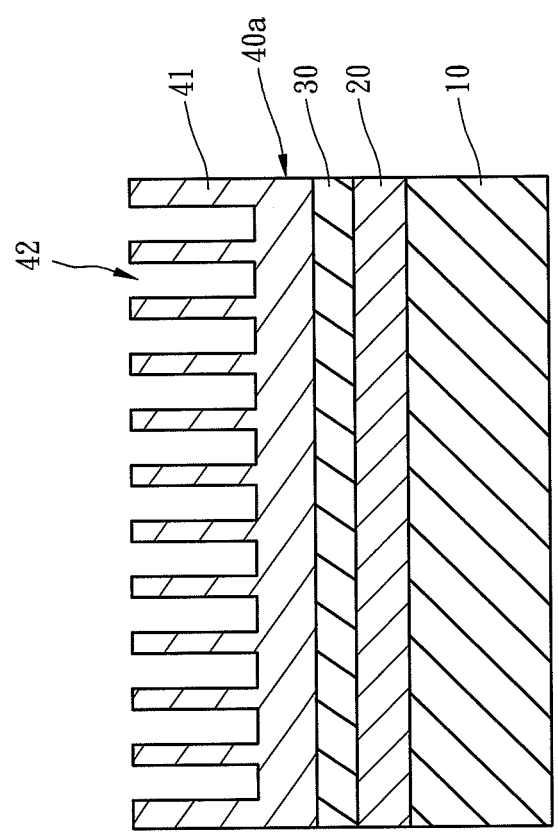
Figure 2F:
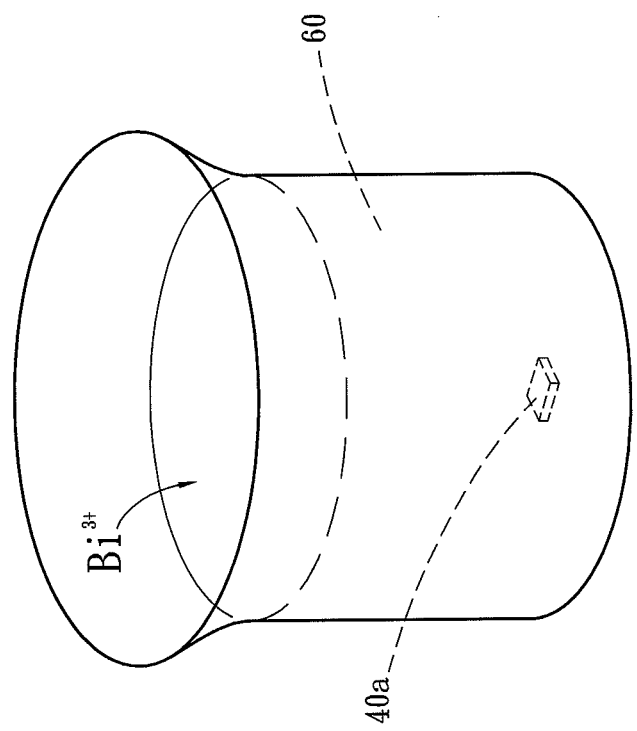
Figure 2G:
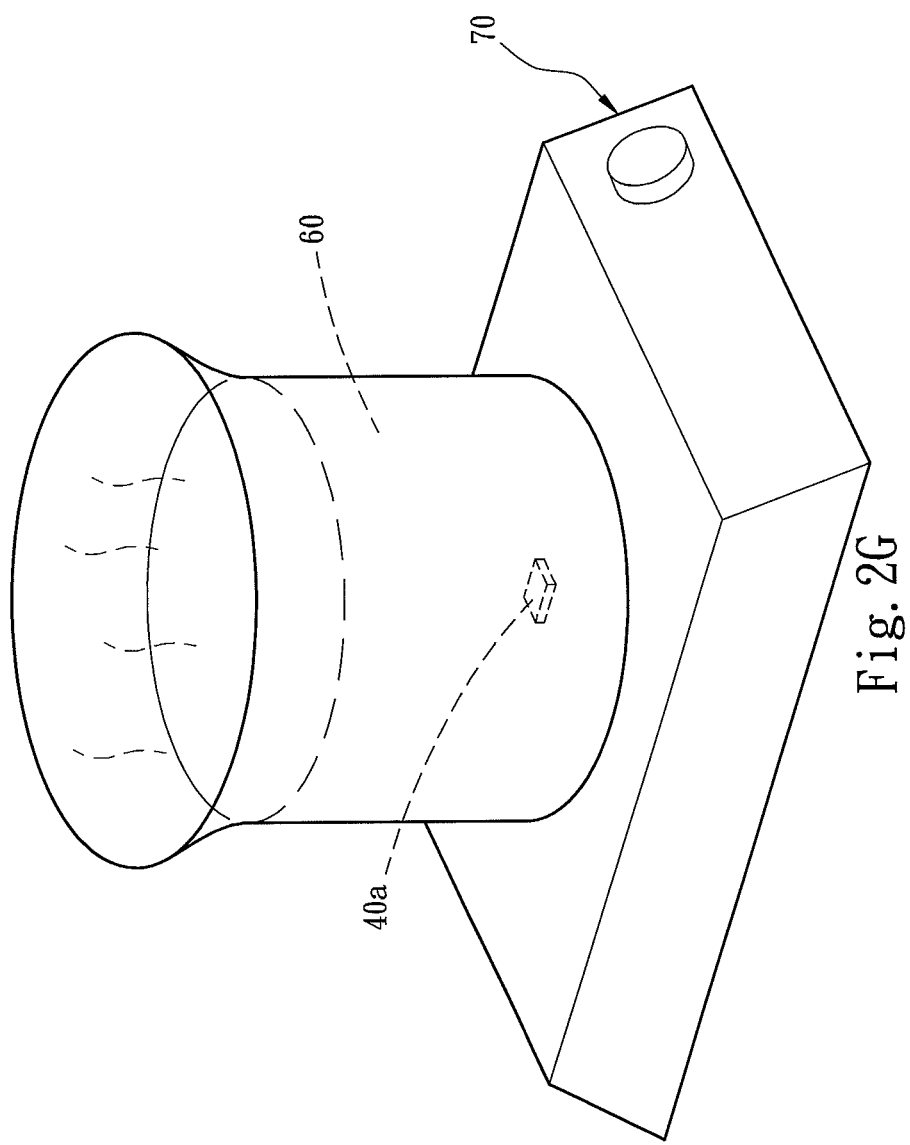
Figure 2H:
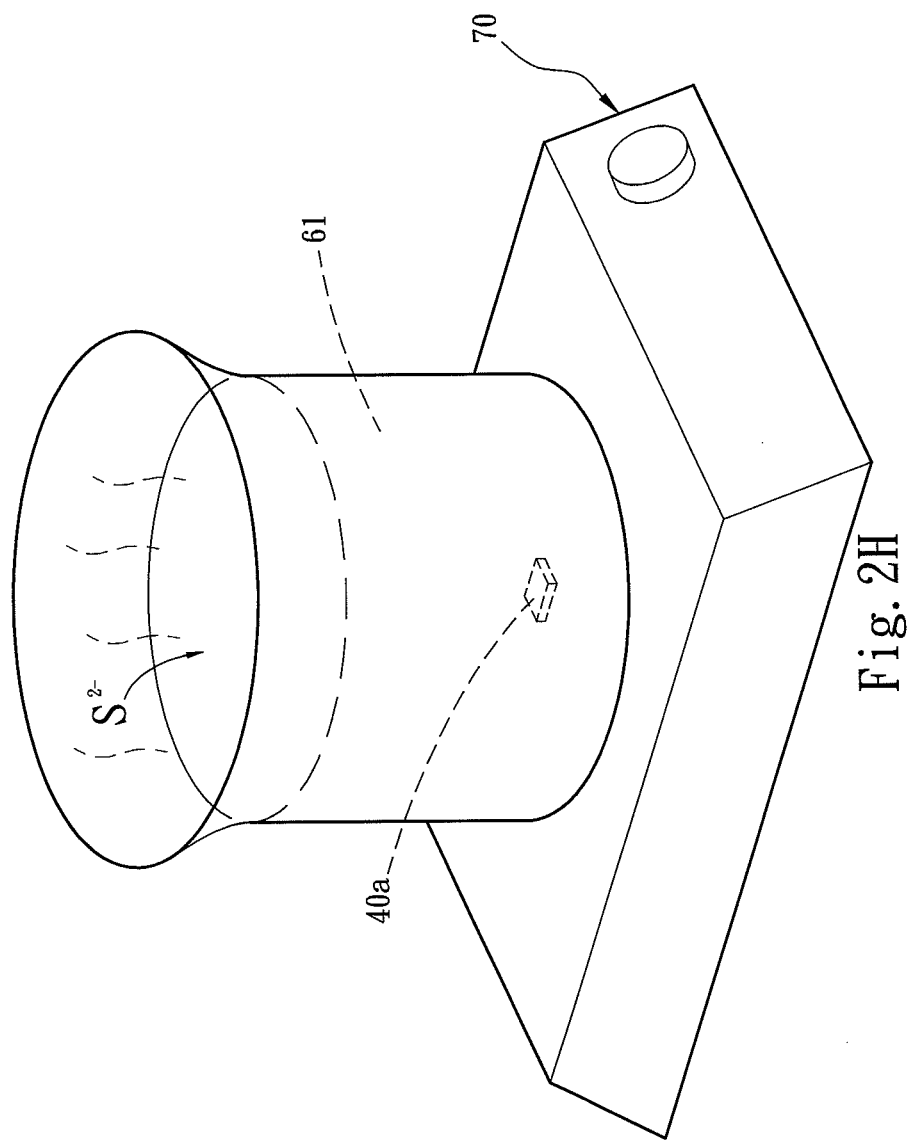
Figure 2I:
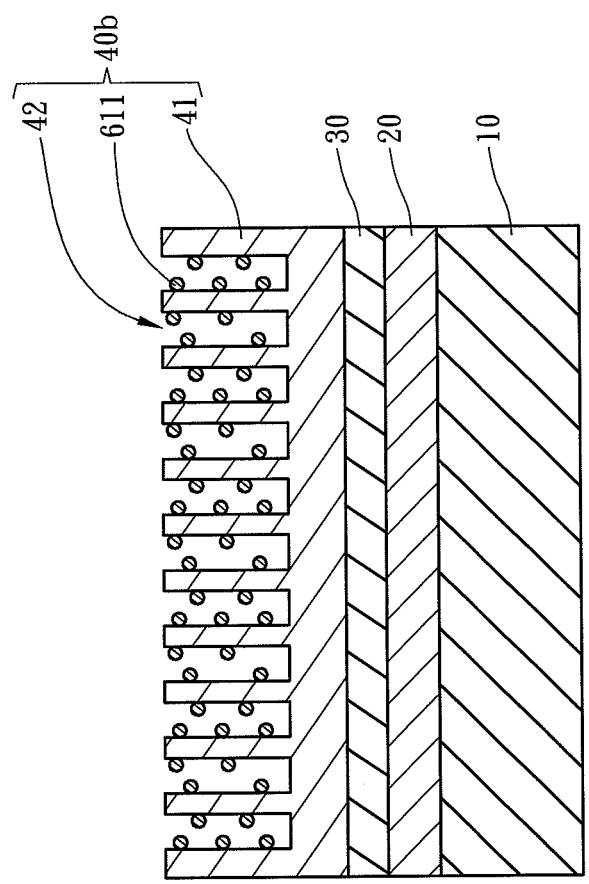

Step S2: form a composite absorption layer 40b (as shown in FIG. 2I) on the first electrode layer 20. In this embodiment, Step S2 includes Step S2a and Step S2b.

Step S2a: form a first polarity layer 30 on the first electrode layer 20 as shown in FIG. 2B. In this embodiment, a PECVD (Plasma-Enhanced Chemical Vapor Deposition) method is used to grow a P-type silicon layer as the first polarity layer 30, wherein the P-type silicon may be amorphous, single-crystalline or polycrystalline silicon.

Step S2b: form a silicon layer 40a on the first polarity layer 30 as shown in FIG. 2C. In this embodiment, a PECVD method is used to grow the silicon layer 40a on the first polarity layer 30. In this embodiment, the silicon layer 40a is made of amorphous, single-crystalline or polycrystalline intrinsic silicon. In the present invention, the silicon layer 40a may be replaced with a layer made of titanium dioxide ($TiO_2$), zinc oxide (ZnO), gallium arsenide (GaAs), germanium (Ge), silicon carbide (SiC), silicon germanium (SiGe), gallium nitride (GaN), gallium phosphide (GaP), indium phosphide (InP), indium nitride (InN) or indium arsenide (InAs).

Step S3: etch the silicon layer 40a to form a plurality of nano-pillars 41 vertical to the first polarity layer 30 with gaps 42, each of which is formed between any two adjacent nano-pillars 41. In this embodiment, Step S3 includes Step S3a and Step S3b.

Step S3a: soak the substrate 10 with the finished silicon layer 40a in a mixed solution containing hydrofluoric acid and silver nitrate to allow a plurality of silver nano-particles 50 to be deposited on the surface of the silicon layer 40a, which is far away from the first polarity layer 30 as shown in FIG. 2D. In detail, a redox reaction occurs between silver ions of the mixed solution and the intrinsic silicon of the silicon layer 40a, whereby the silver ions are reduced to the silver nano-particles 50, and a portion of the intrinsic silicon is oxidized into silicon oxide.

Step S3b: soak the substrate 10 containing the silicon layer 40a with the silver nano-particles 50 in an etching solution containing hydrofluoric acid and iron nitrate to etch the silicon layer 40a, thus a plurality of nano-pillars 41 are formed on the silicon layer 40a and vertical to the first polarity layer 30 to allow a plurality of gaps 42 to be formed among the nano-pillars 41 as shown in FIG. 2E. The residual silver nano-particles 50 on the silicon layer 40a are removed then. In detail, the silver nano-particles 50 function as a catalyst to catalyze the oxidization reaction of the silicon layer 40a to allow the silicon layer 40a under the silver nano-particles 50 to be oxidized into silicon oxide. Then, hydrofluoric acid dissolves the silicon oxide to make the silver nano-particles 50 sink, whereby the nano-pillars 41 are indirectly formed. The size of the gaps 42 is determined by the size of the silver nano-particles 50. The residual silver nano-particles 50 are removed via soaking the semi-finished product in a solution containing nitric acid.

Step S4: let the silicon layer 40a containing the nano-pillars 41 contact a mixed solution 61 containing bismuth ions and sulfur ions to allow a plurality of bismuth sulfide nano-particles 611 to be deposited in the gaps 42 and attached to the nano-pillars 41 in a self-assembly method, whereby the silicon layer 40a containing the nano-pillars 41 and the bismuth sulfide nano-particles 611 becomes a composite absorption layer 40b having a self-assembly nano-composite structure. In this embodiment, Step S4 includes Steps S4a-S4d.

Step S4a: surface-treat the silicon layer 40a containing the nano-pillars 41, and soak the substrate 10 in an ethanol solution 60 containing bismuth ions and a stabilizer as shown in FIG. 2F. In this embodiment, the bismuth ions are formed by adding bismuth iodide into the ethanol solution 60, and the stabilizer is 3-MPA (3-Mercaptopropionic acid).

Step S4b: add a dispersing agent into the ethanol solution 60, and heat the ethanol solution 60 to a reaction temperature via a heater 70 as shown in FIG. 2G. In this embodiment, the dispersing agent is CTAB (Hexadecyltrimethyl ammonium bromide); the reaction temperature is between 40 and 70° C., preferably 50° C.

Step S4c: add sulfur ions into the ethanol solution 60 to form a mixed solution 61, and maintain the mixed solution 61 at the reaction temperature as shown in FIG. 2H, whereby the bismuth ions and the sulfur ions form the bismuth sulfide nano-particles 611 in the mixed solution 61 as shown in FIG. 2I. The dispersing agent is added to make the bismuth sulfide nano-particles 611 uniformly distribute in the mixed solution 61.

Step S4d: take the substrate 10 containing the silicon layer 40a and the nano-pillars 41 out of the mixed solution 61 to be washed and dried as shown in FIG. 2I. At this stage, the bismuth sulfide nano-particles 611 are attached to the nano-pillars 41 in a self-assembly way to form a composite absorption layer 40b having a self-assembly nano-composite structure.

This embodiment further comprises Step S5 and Step S6.

Figure 2J:
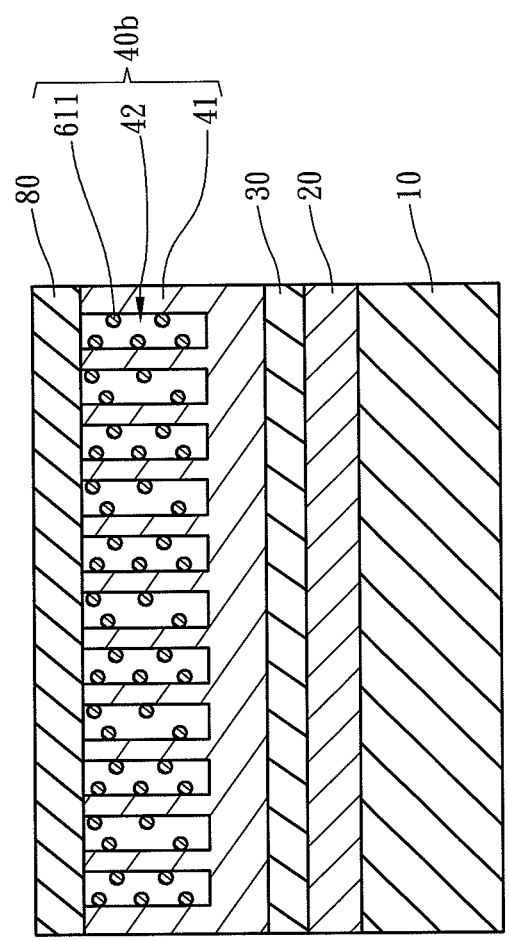

Step S5: form a second polarity layer 80 on the composite absorption layer 40b, whereby the composite absorption layer 40b is interposed between the first polarity layer 30 and the second polarity layer 80 as shown in FIG. 2J. In this embodiment, a PECVD method is used to form an N-type silicon layer as the second polarity layer 80 on the nano-pillars 41. The N-type silicon may be amorphous, single-crystalline, or polycrystalline silicon. Thus, the first polarity layer 30, the composite absorption layer 40b and the second polarity layer 80 jointly form the P-I-N structure in a solar cell.

Figure 2K:
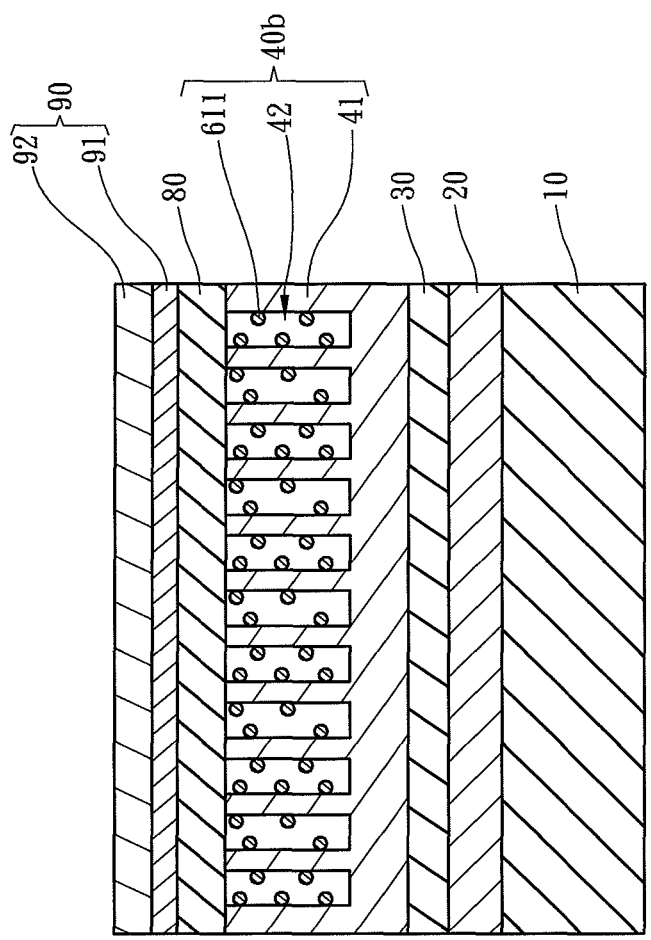

Step S6: form a second electrode layer 90 on the second polarity layer 80, whereby the second polarity layer 80 is interposed between the composite absorption layer 40b and the second electrode layer 90 as shown in FIG. 2K. Thus a self-assembly nano-composite solar cell is completed. In this embodiment, the second electrode layer 90 includes a transparent conductive oxide layer 91 formed on the second polarity layer 80 and a metal conductive layer 92 formed on the transparent conductive oxide layer 91. In this embodiment, the transparent conductive oxide layer 91 is made of aluminum zinc oxide (AZO). In the present invention, the transparent conductive oxide layer 91 may also be made of tin oxide ($SnO_2$), zinc oxide (ZnO), indium tin oxide (ITO), gallium zinc oxide (GZO), or indium zinc oxide (IZO). In this embodiment, the metal conductive layer 92 is made of silver, but not limited to silver. In the present invention, the metal conductive layer 92 may also be made of another conductive metal.

Figure 3:
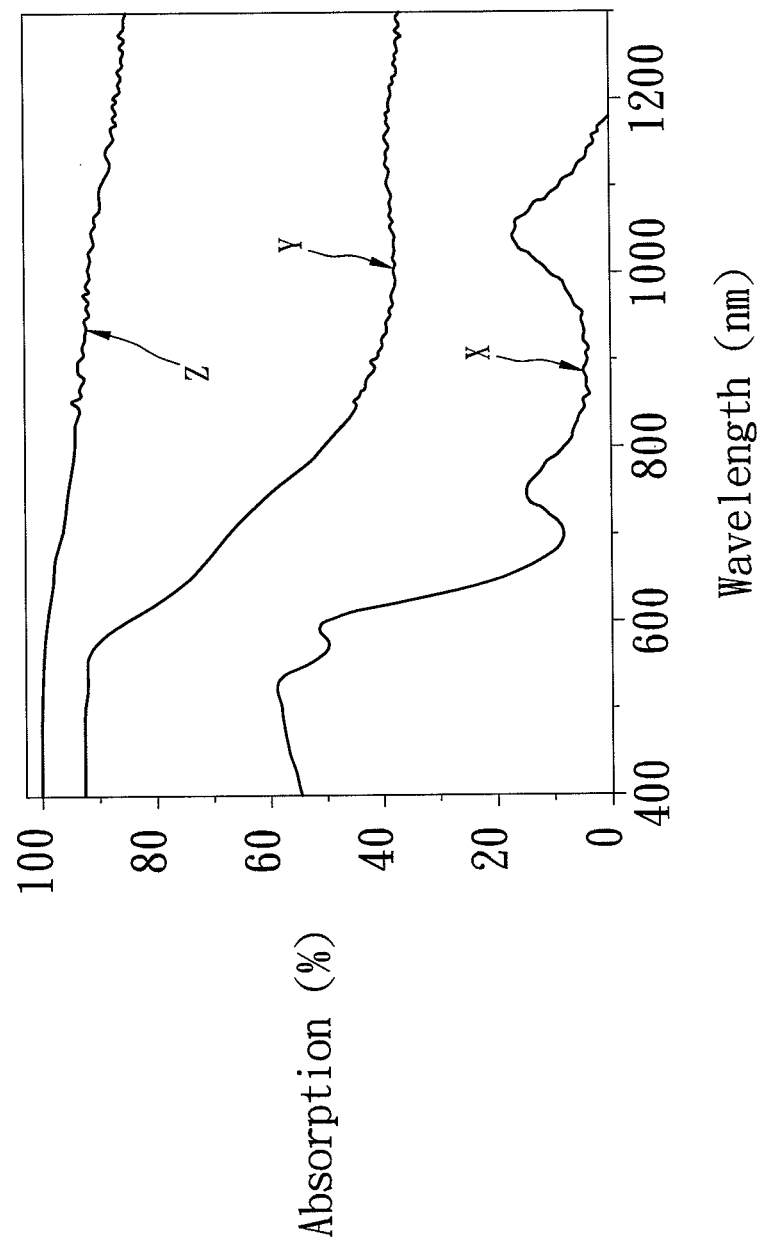
FIG. 3 is a diagram showing absorption spectra of conventional amorphous silicon thin film and the nano-composite absorption layers of the present invention.

Refer to FIG. 3 for comparison between the conventional solar cells and the solar cell of the present invention, wherein Curve X represents an amorphous-silicon thin-film solar cell, Curve Y represents an amorphous-silicon thin-film solar cell with nano-pillar structure, and Curve Z represents an amorphous-silicon thin-film solar cell with self-assembly nano-composite structure. In the present invention, the nano-pillars 41 reduces the diffusion distance of carriers and thus increases the light absorption efficiency of the composite absorption layer 40b, and the bismuth sulfide nano-particles 611 increase the absorption spectrum range of the composite absorption layer 40b and enhances effective carrier collection. Therefore, the present invention can greatly increase the range of the absorbable wavelengths and the efficiency of light absorption of a solar cell.

In conclusion, the present invention uses the nano-pillars to reduce reflection of incident light and shorten diffusion distance of carriers. The present invention further uses the bismuth sulfide nano-particles to expand the absorption wavelength range of the incident light, thus the power conversion efficiency of the solar cell is further promoted. The nano-pillars and bismuth sulfide nano-particles are respectively fabricated via etching and soaking in mixed solutions, whereby the length of the nano-pillars is easily controlled and the bismuth sulfide nano-particles can be self-assembled. Thus the present invention is exempted from using a vacuum system, and has advantages of simple processes, low cost, fast and large-area production. Hence, the present invention possesses utility, novelty and non-obviousness and meets the condition for a patent. Thus, the Inventors file the application for a patent. It is appreciated if the patent is approved fast.

The embodiments described above are only to exemplify the present invention but not to limit the scope of the present invention. Any equivalent modification or variation according to the spirit of the present invention is to be also included within the scope of the present invention.

What is claimed is:

1. A self-assembly nano-composite solar cell, comprising a substrate;
a first electrode layer formed on the substrate;

a composite absorption layer formed over the first electrode layer and including a plurality of vertical nano-pillars made of amorphous silicon, a plurality of gaps each formed between any two adjacent nano-pillars, and a plurality of bismuth sulfide nano-particles filled into the plurality of gaps and attached to the plurality of nano-pillars to increase the absorption wavelength range of incident light and to increase the generation of electron-hole pairs; and a second electrode layer formed over the composite absorption layer to allow the composite absorption layer to be arranged between the first electrode layer and the second electrode layer.

2. The self-assembly nano-composite solar cell according to claim 1, wherein the substrate is made of glass.

3. The self-assembly nano-composite solar cell according to claim 1, wherein the first electrode layer is made of transparent conductive oxide.

4. The self-assembly nano-composite solar cell according to claim 1, wherein the composite absorption layer is made of intrinsic amorphous silicon.

5. The self-assembly nano-composite solar cell according to claim 1 further comprising a first polarity layer arranged between the first electrode layer and the composite absorption layer.

6. The self-assembly nano-composite solar cell according to claim 5, wherein the first polarity layer is made of P-type amorphous silicon.

7. The self-assembly nano-composite solar cell according to claim 1, wherein the second electrode layer includes a metal conductive layer formed over the composite absorption layer and a transparent conductive oxide layer formed between the metal conductive layer and the composite absorption layer.

8. The self-assembly nano-composite solar cell according to claim 1 further comprising a second polarity layer arranged between the composite absorption layer and the second electrode layer.

9. The self-assembly nano-composite solar cell according to claim 8, wherein the second polarity layer is made of N-type amorphous silicon.

* * * * *